US011950390B2

(12) United States Patent
Furco et al.

(10) Patent No.: US 11,950,390 B2
(45) Date of Patent: Apr. 2, 2024

(54) CONDUCTOR ASSEMBLY FOR A POWER DISTRIBUTION SYSTEM

(71) Applicant: Eaton Intelligent Power Limited, Dublin (IE)

(72) Inventors: Joel Anthony Furco, Baldwinsville, NY (US); Andrew Francis Scarlata, West Monroe, NY (US); Joseph M. Manahan, Manlius, NY (US); Patrick S. Ward, Newfield, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 755 days.

(21) Appl. No.: 17/082,077

(22) Filed: Oct. 28, 2020

(65) Prior Publication Data
US 2021/0127521 A1 Apr. 29, 2021

Related U.S. Application Data

(60) Provisional application No. 62/927,040, filed on Oct. 28, 2019.

(51) Int. Cl.
*H05K 7/14* (2006.01)
*H01H 71/08* (2006.01)
*H01R 4/48* (2006.01)
*H01R 12/77* (2011.01)
*H02B 1/056* (2006.01)
*H02B 1/24* (2006.01)

(52) U.S. Cl.
CPC ........... *H05K 7/1457* (2013.01); *H01H 71/08* (2013.01); *H01R 4/48* (2013.01); *H01R 12/77* (2013.01); *H02B 1/056* (2013.01); *H02B 1/24* (2013.01)

(58) Field of Classification Search
CPC .................................................. H05K 17/1457
USPC .......................................................... 361/679
See application file for complete search history.

(56) References Cited

U.S. PATENT DOCUMENTS

| 2,738,445 | A | 3/1956 | Hammerly |
| 5,272,592 | A | 12/1993 | Harris et al. |
| 7,338,331 | B2 | 3/2008 | Yoon |
| 7,660,102 | B2 | 2/2010 | Brutsch |
| 8,235,732 | B2 | 8/2012 | Garascia et al. |
| 8,547,684 | B2 | 10/2013 | Diaz |
| 8,625,256 | B2 | 1/2014 | Schmid |
| 8,711,547 | B2 | 4/2014 | Mazano et al. |
| 8,859,897 | B2 | 10/2014 | Hadi et al. |
| 9,033,721 | B2 | 5/2015 | Graf et al. |
| 9,685,715 | B2 | 6/2017 | Yamauchi et al. |
| 2007/0254532 | A1 | 11/2007 | Yoon |

(Continued)

FOREIGN PATENT DOCUMENTS

| DE | 10 2013 107292 | * | 1/2015 |
| DE | 10 2013 107292 A1 | | 1/2015 |
| KR | 101281700 B1 | | 7/2013 |

OTHER PUBLICATIONS

Extended European Search Report for Application No. 20204507.6, dated Apr. 7, 2021, 17 pages, Munich, Germany.

*Primary Examiner* — Stanley Tso
(74) *Attorney, Agent, or Firm* — Stinson LLP

(57) ABSTRACT

An electrical conductor assembly for use in a power distribution assembly includes an electrical conductor and a casing covering at least a portion of the electrical conductor. A spring member is mounted to the casing and configured to apply a compressive force to the electrical conductor.

20 Claims, 17 Drawing Sheets

(56) References Cited

U.S. PATENT DOCUMENTS

| | | | |
|---|---|---|---|
| 2008/0220635 A1* | 9/2008 | Wagener | H02B 1/21 439/114 |
| 2013/0068495 A1* | 3/2013 | Hadi | H01R 25/14 174/68.2 |
| 2020/0194977 A1 | 6/2020 | Furco et al. | |

* cited by examiner

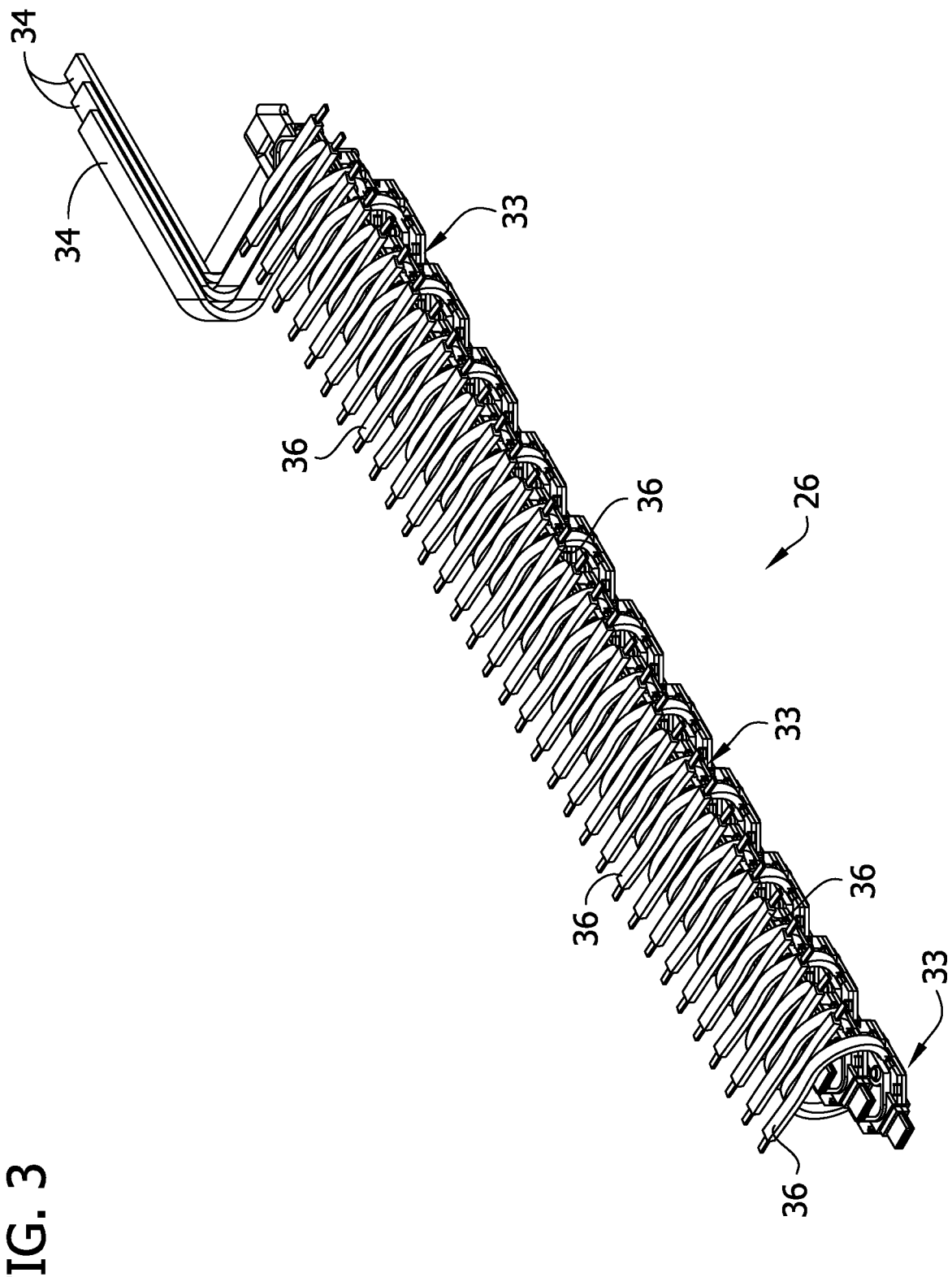

CONDUCTOR ASSEMBLY FOR A POWER DISTRIBUTION SYSTEM

CROSS-REFERENCE TO RELATED APPLICATION

This application claims priority to U.S. Provisional Patent Application Ser. No. 62/927,040, filed Oct. 28, 2019, which is hereby incorporated by reference in its entirety.

FIELD

The present disclosure generally relates to a power distribution system, and more particularly to a flexible conductor chassis assembly for a power distribution system.

BACKGROUND

Electrical apparatus, such as electrical switching apparatus or electrical meters used in power distribution systems, are often mounted on or within an electrical enclosure (e.g., without limitation, a panel board; a load center; a meter breaker panel) either individually or in combination with other electrical meters or switchgear (e.g., without limitation, circuit switching devices and circuit interrupters such as circuit breakers, contactors, motor starters, motor controllers and other load controllers). The electrical enclosure is typically coupled to and supported by a structure such as, for example, a wall of a building, and includes a number of electrical bus members.

In industrial applications the available space is limited. Therefore, in order to maximize the space for process equipment and minimize the installation cost, it is beneficial to design power distribution equipment, such as panel boards, in the smallest possible footprint. In typical residential and commercial applications the circuit breakers have a consistent pole to pole spacing since typically the electromechanical device created for 1 pole is equally replicated when 2, 3 or more are needed. In hazardous locations, those same circuit breakers are enclosed or encapsulated to make them suitable for combustible atmospheres. In doing so, the enclosure footprint around the individual circuit breakers is minimized to reduce the effects of an internal explosion. As a result, the pole to pole spacing of a hazardous area circuit breaker may not be in consistent pole to pole spacing increments like an ordinary breaker and therefore flexible bus bars create significant advantages in making breaker panel systems with any breaker, especially hazardous area rated breakers or cases when different manufacturer's designs are used within the same panel, where the pole to pole spacing is inconsistent. Also, panel boards typically include at least one rigid bus bar acting as an electrical conductor for delivering electricity to the electrical switching apparatus. The rigid nature of the bus bar restricts the positioning of the switching apparatus within the panel board and the type of switching apparatus that can be used within the panel board. Typical rigid bus bars include multiple connection points which can be expensive to manufacture and increase assembly time. Further, joints between two attached conductors can increase electrical resistance creating thermal hot spots within the enclosure that may lead to increased frequency and cost of maintenance. For example, when a breaker is bolted directly to a bus bar there may be a relatively high resistance across that joint connection. This is shown in FIG. 1A where conductors 1A include elongate rigid bus bar sections 3A having rigid branch conductors 5A separately attached to the bus bar sections by fasteners 7A. This system has an increased electrical resistance thereby creating thermal resistance leading to increased temperature or hot spots further leading to increased frequency and cost of maintenance. Also, the joints may loosen as a result of temperature cycling increasing the resistance and temperature rise at the connection point. Loose connections may also lead to arcing which could be a source of ignition in a hazardous/combustible atmosphere. Panel boards can also have exposed live conductors which are a shock hazard to operators and maintenance workers.

An example of another rigid conductor assembly of the prior art is shown in FIG. 1B. Each conductor 1B includes an elongate rigid central bus bar portion 3B and a plurality of rigid branch sections 5B extending laterally from the central bus bar portion. The branch sections 5B are bent to accommodate stacking multiple conductor assemblies on top of each other for distributing multiple phases of electricity. This system, however, is only configured to accommodate one switchgear arrangement and limited types of switchgears. Additionally, the bus bar in FIG. 1B is arranged for breakers with consistent pole to pole spacing. FIG. 1B is of a bus bar that is specifically designed for breakers that do not have consistent pole to pole spacing. However, as a result and because of its inherent rigidity, the bus bar must be replaced should a change in breaker be needed. It also must have multiple sections spliced together should breakers of different pole quantities be required in the same system. Thus, this bus bar arrangement requires a unique bus bar assembly for each breaker system layout required. Therefore, should the electrical system require a new breaker layout for any reason during the life of the system, complete replacement of the bus bar assembly is required increasing the cost and complicating the planning required for these maintenance events due to component availability. Further, these logistical challenges impact the availability to manufacture and inventory carrying costs of products yet to be configured for customer orders.

SUMMARY

In one aspect, an electrical conductor assembly for use in a power distribution assembly generally comprises an electrical conductor and a casing covering at least a portion of the electrical conductor. A spring member is mounted to the casing and configured to apply a compressive force to the electrical conductor In another aspect, a power distribution assembly comprises an enclosure and a flexible electrical conductor disposed in the enclosure. The flexible electrical conductor comprises a main conductor portion comprising electrically conductive material and a plurality of branch members comprising electrically conductive material extending laterally from the main conductor portion. Each branch member is selectively bendable and configured for electrical connection to an electrical switching apparatus. A plurality of casings cover portions of the flexible electrical conductor. Each casing includes a spring member mounted to the casing and configured to apply a compressive force to the flexible electrical conductor.

BRIEF DESCRIPTION OF THE DRAWINGS

FIG. 3 is a perspective of a conductor assembly showing branch members of a conductor of the conductor assembly in a bent configuration for being attached to switching apparatuses;

Corresponding reference characters indicate corresponding parts throughout the drawings.

DETAILED DESCRIPTION

Figure 1A:
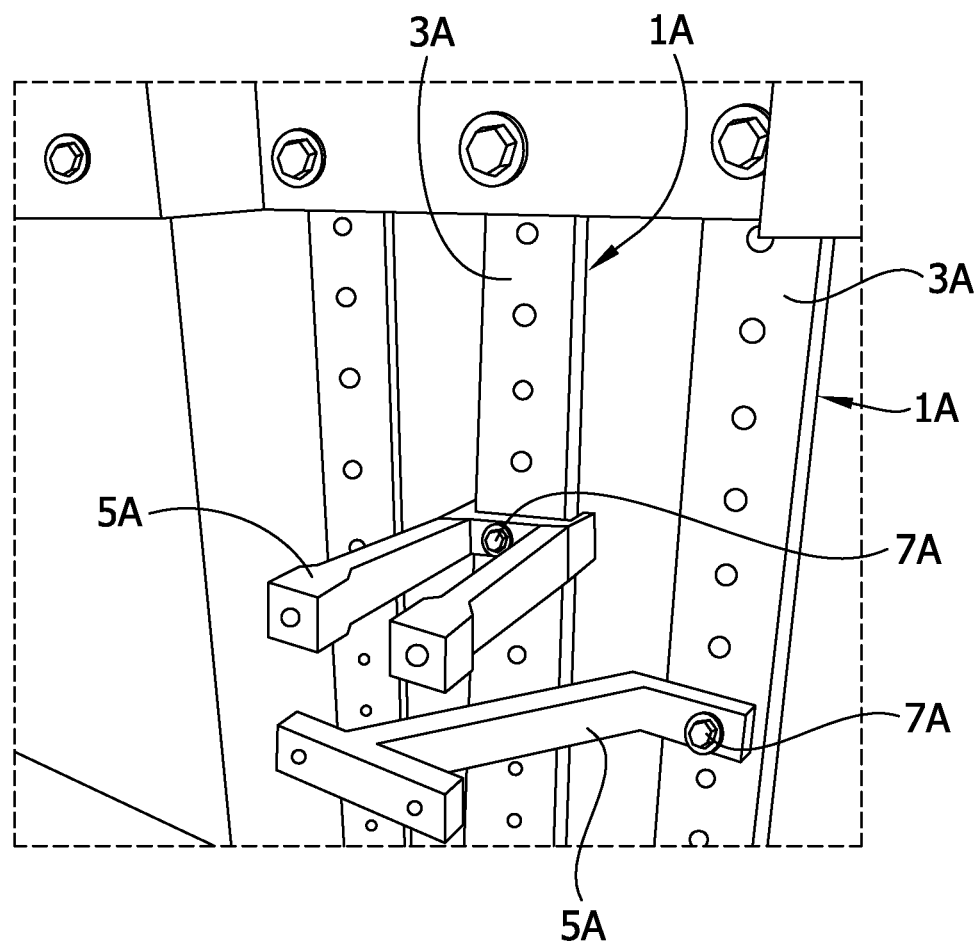
FIG. 1A is a perspective of a prior art conductor assembly.
Figure 1B:
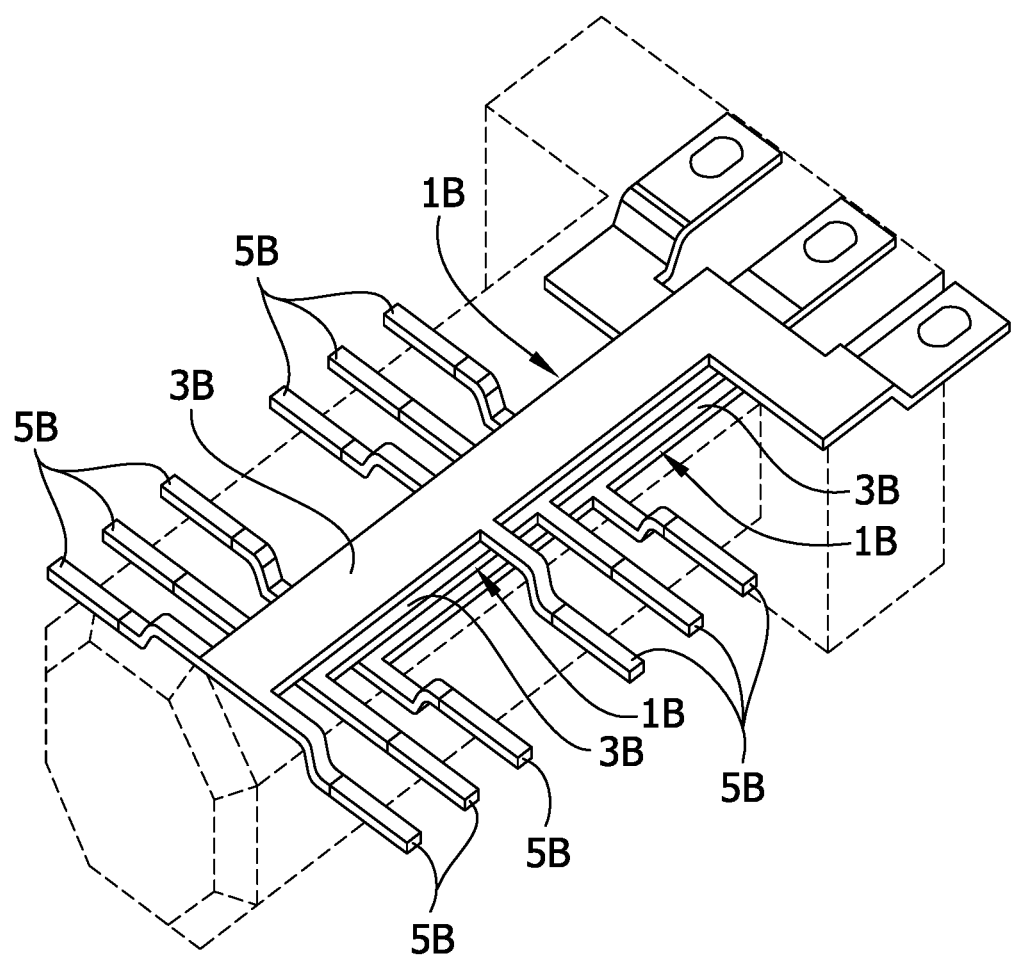
FIG. 1B is a perspective of another prior art conductor assembly.
Figure 2A:
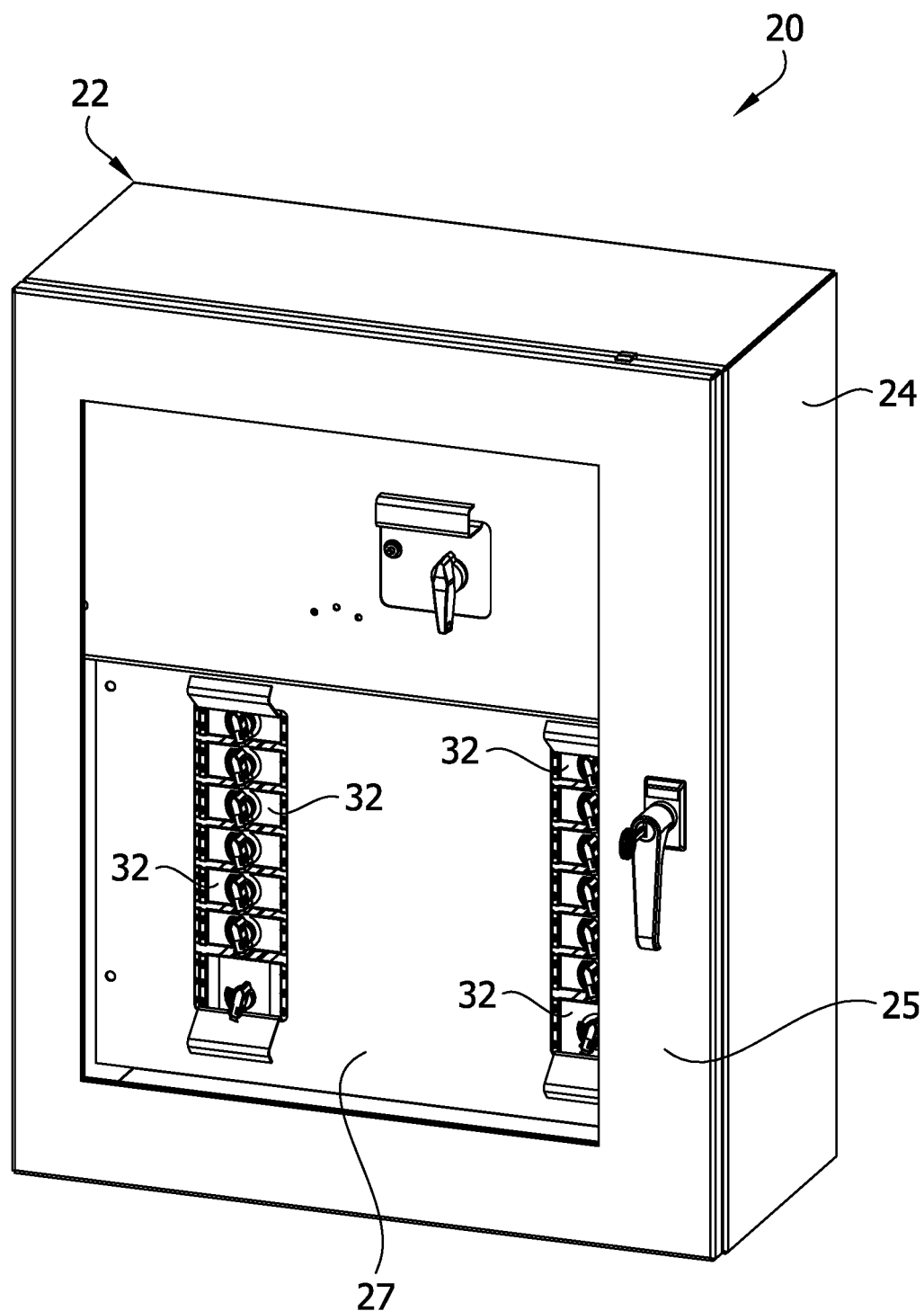
FIG. 2A is a perspective of a power distribution assembly including an enclosure.

Referring to FIGS. 2A-3, one embodiment of a power distribution assembly is generally indicated at 20. The power distribution assembly 20 includes an electrical enclosure generally indicated at 22. The enclosure 22 includes a housing 24 which can be made from any suitable material such as stainless steel, plastic, etc. The housing 24 can include a door or cover 25 or any other structure for providing access to the internal components of the enclosure 22. The housing 24 may also include an internal cover or "dead front" cover 27 within the interior of the housing. The "dead front" cover 27 has cutouts for receiving switching apparatuses 32. An electrical conductor assembly 26 is housed within the enclosure 22 and comprises a plurality of electrical conductors 30. The electrical conductors 30 are separated from each other by casings 33 which mount the conductors in the enclosure and at least partially cover the conductors to ensure that the proper electrical spacing is maintained within the assembly 26. Thus, the casings 33 also insulate the conductors 30. In the illustrated embodiment, multiple conductors 30 and multiple casings 33 form the conduct assembly 26. However, a single electrical conductor 30 and a single casing 33 may also be considered an electrical conductor assembly.

Each conductor 30 of the conductor assembly 26 is configured to electrically connect to multiple electrical switching apparatuses 32 such as, for example and without limitation, circuit breakers. In the illustrated embodiment, the multiple conductors 30 facilitate distributing multiple phases of electricity. While the switching apparatus 32 are described as circuit breakers, any known or suitable type and/or configuration of electrical switching apparatus could be employed, without departing from the scope of the present disclosure. To that extent, the conductor 30 enables the combination of different circuit breaker manufacturer's equipment having different structures within a single system. This combination of different circuit breakers would not be possible in a rigid bus bar system. For this reason, it is standard for panel board systems incorporating rigid bus bars to specify a single suitable switching apparatus manufacturer for use in the system. The conductor assembly 26 of the current disclosure alleviates the needs for such a restriction. In one embodiment, the electrical conductor 30 is an electrical bus which carries or transfers voltage, current, or power.

As employed herein, the term "enclosure" refers to any suitable structure for housing an electrical switching apparatus (e.g., without limitation, circuit switching devices and circuit interrupters such as circuit breakers, contactors, motor starters, motor controllers and other load controllers) and expressly includes, without limitation, panel boards, load centers and switchgear cabinets, as well as other structures or compartments which are covered with a panel, such as, for example and without limitation, in a prepared opening in the wall of a building, in a piece of machinery, or in a vehicle.

As employed herein, the statement that two or more parts are "attached" together shall mean that the parts are joined together either directly or joined through one or more intermediate parts.

As employed herein the term "fastener" refers to any suitable connecting or tightening mechanism including, but not limited to, rivets, screws, bolts, and the combinations of bolts and nuts (e.g., without limitation, lock nuts) and bolts, washers and nuts.

Figure 4:
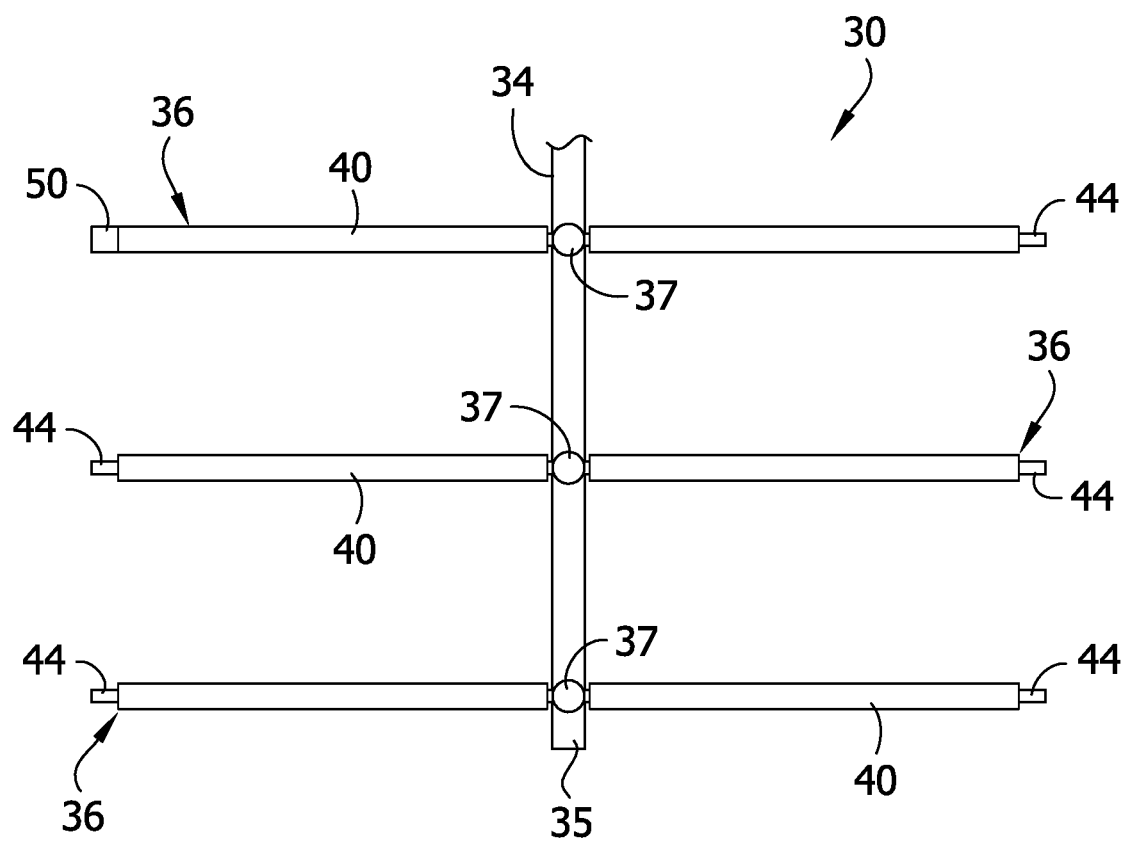
FIG. 4 is a front view of a fragmentary portion of the conductor.

Referring to FIG. 4, each electrical conductor 30 comprises a partially flexible electrical conductor. In the illustrated embodiment, each conductor 30 includes an elongate rigid central conductor portion 35, an elongate flexible central conductor portion 34 attached to the rigid conductor portion, and a plurality of elongate flexible branch members 36 attached to the rigid central conductor portion 35 and extending laterally outward from the rigid central conductor portion. The branch members 36 may be attached to the rigid conductor portion 35 by any suitable means. For example, threaded fasteners, rivets, welding, adhesive, clamps, or any other suitable attachment mechanism may be used to attach the branch members 36 to the rigid conductor portion 35. In the illustrated embodiment, welds 37 attach the branch members 36 to the rigid central conductor portion 35. Thus, in one embodiment, the flexible branch members 36 are formed separately from the central conductor portion 35. Alternatively, the casing 33 can be used to attach the branch members 36 and the flexible central conductor portion 34 to the central conductor portion 35, as will be explained in greater detail below. Also, the branch members 36 could be formed integrally with the central conductor portion 35. Each branch member 36 is configured for electrically connecting to a switching apparatus 32. Therefore, each conductor 30 provides a flexible electrically conductive chassis for making multiple electrical connections to different switching apparatuses 32. The elongate rigid central conductor portion 35 and the elongate flexible central conductor portion 34 may be broadly considered a main conductor portion. Alternatively, just the rigid central conductor portion 35 may be considered a main conductor portion. Additionally, the entire central conductor portion may be flexible.

Figure 5:
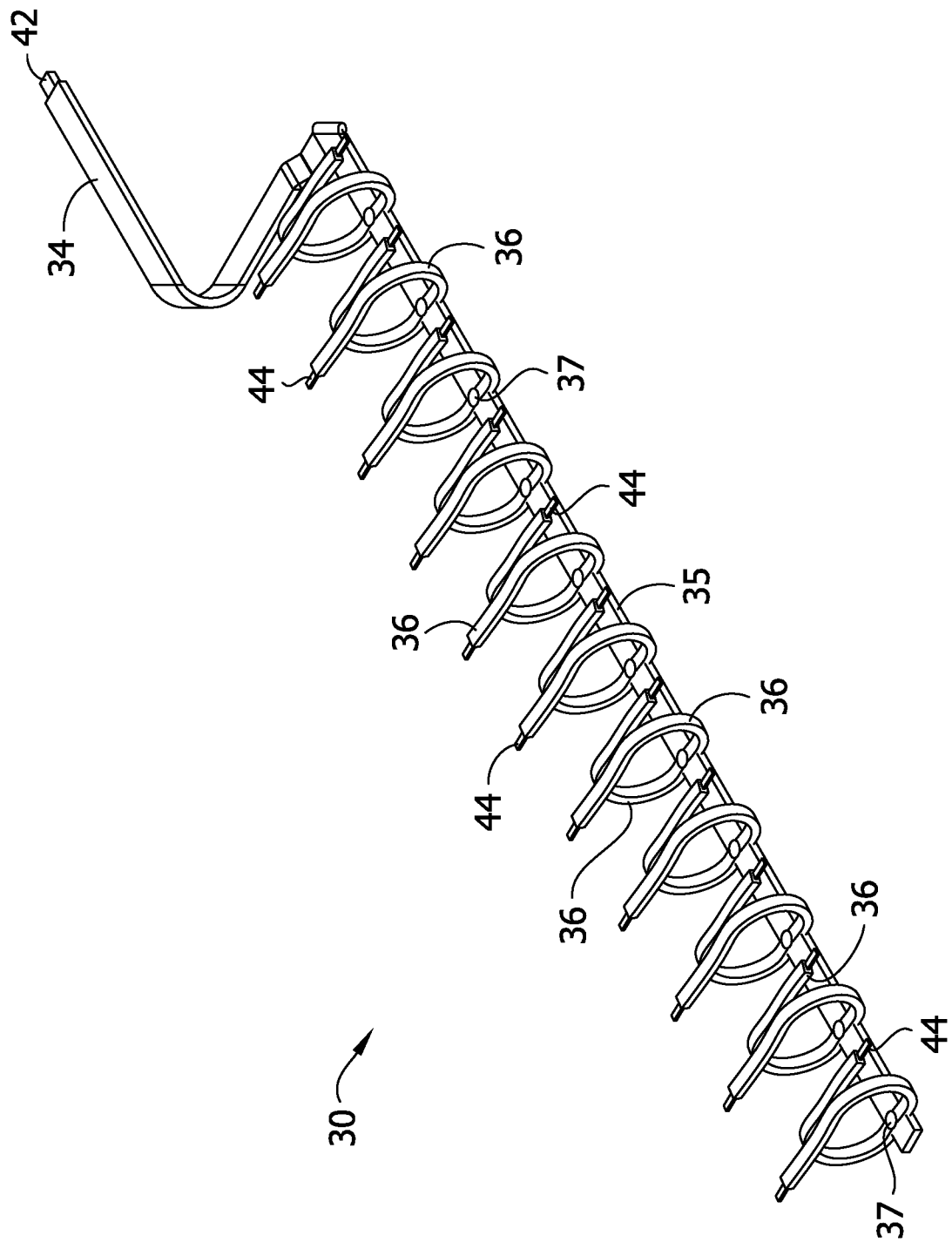
FIG. 5 is a perspective of the conductor in the bent configuration.

The rigid conductor portion 35, flexible conductor portion 34, and each flexible branch member 36 individually comprise generally rectangular components. Other configurations of the conductor portions 34, 35 and branch members 36 are also envisioned without departing from the scope of the disclosure. In FIG. 4 there are shown three (3) branch members 36 extending perpendicularly outwardly from opposite sides of the rigid central conductor portion 35, and in FIG. 5, eleven (11) branch members 36 are shown. It will be understood that other numbers of branch members 36 are also envisioned. Further, the central conductor portion 34 can be shortened or lengthened to accommodate the desired number of branch members 36. Also, while each branch member 36 is shown as extending laterally from both sides of the rigid conductor portion 35, one or more branch members could be separated into two separate branch members and suitably attached to opposite sides of the rigid conductor portion. As illustrated, the sections of the branch members 36 on one side of the central conductor portion 34 are aligned along a longitudinal axis of the central conductor portion with a section of the branch member on the opposite side of the central conductor portion. Alternatively, one or more branch members could be staggered or offset along a longitudinal axis of the rigid central conductor portion 35 relative to the branch members on the opposite side of the rigid central conductor portion.

The rigid central conductor portion 35 may comprise a standard copper bus bar member, and the flexible central conductor portion 34 and the branch members 36 may each comprise multiple layers of laminated conductive material such as copper, aluminum, or any other suitable electrically conductive material. The layers of conductive material may also be plated with the same or another electrically conductive material such as tin, silver, aluminum, or any other suitably conductive coatings. It will be understood that the central conductor portions 34, 35 and branch members 36 can have over configurations without departing from the scope of the disclosure. Insulation covers or sleeves 40 surround the flexible central conductor portions 34 and the flexible branch members 36 of the conductors 30. In the illustrated embodiment, the covers 40 surround a substantial portion of the flexible central conductor portion 34 and branch members 36 but do not surround their entireties. As shown, the covers 40 surround substantially an entirety of the flexible central conductor portions 34 but does not cover free end sections 42 (FIG. 5) of the flexible central conductor portions. Similarly, the covers 40 surround substantially an entirety of the branch members 36 but do not cover free end sections 44 of the branch members. The exposed free end sections 42, 44 are configured for electrically connecting with the switching apparatuses 32. For example, main circuit breakers may be electrically connected to the free end sections 42 of the flexible central conductor portions 34, and branch circuit breakers may be electrically connected to the free end sections 44 of the branch members 36. Referring to FIG. 4, a cap 50 may cover the free end sections 44 of at least some of the branch members 36. For example, a cap 50 may be placed over the free end sections 44 of the branch members 36 that are not connected to a switching apparatus 32. The covers 40 and caps 50 may be formed by overmold or by extrusion. In one embodiment, the cover 40 surrounding the central conductor portion 34 of the conductor 30 is overmolded on the conductor, and the covers surrounding the branch members 36 are extruded. However, all the covers 40 may be overmolded or extruded without departing from the scope of the disclosure. Suitable materials for forming the cover 40 include, without limitation, thermoplastics including polyvinyl chloride (PVC) and sanipreen.

Alternatively, while the insulation material of the cover 40 is shown as covering a portion, but not all, of the electrically conductive material of the conductor 30, the insulation material of the cover 40 may extend over an entirety of the central conductor portion 34 and/or one or more branch members 36. In this instance, a section of the cover 40 may be removed from the central conductor portion 34 and/or one or more branch members 36 to expose the electrically conductive material for connection to a switching apparatus 32.

The branch members 36 are selectively bendable such that the branch members can be bent in a first configuration to accommodate a first switching apparatus arrangement, and subsequently bent in a second or more configurations, different from the first configuration, to accommodate a second or more switching apparatus arrangements. Thus, the branch members 36 are elastically deformable. The central conductor portion 34 may also be elastically deformable. The conductor 30, including the central conductor portion 34 and the branch members 36, can be bent or folded about multiple axes and/or twisted about an axis to configure the conductor in a desired configuration for a particular use. The bending, folding, and or twisting can be done by hand by an end user. Thus, the conductor 30 can be configured as needed to accommodate switching apparatuses 32 of different sizes and shapes. Moreover, as will be explained in greater detail below, the flexible nature of the conductor 30 allows the switching apparatuses 32 to be properly positioned when multiple conductors are stacked on top of each other within the enclosure 22 for distributing multiple phases of electricity.

Figure 6:
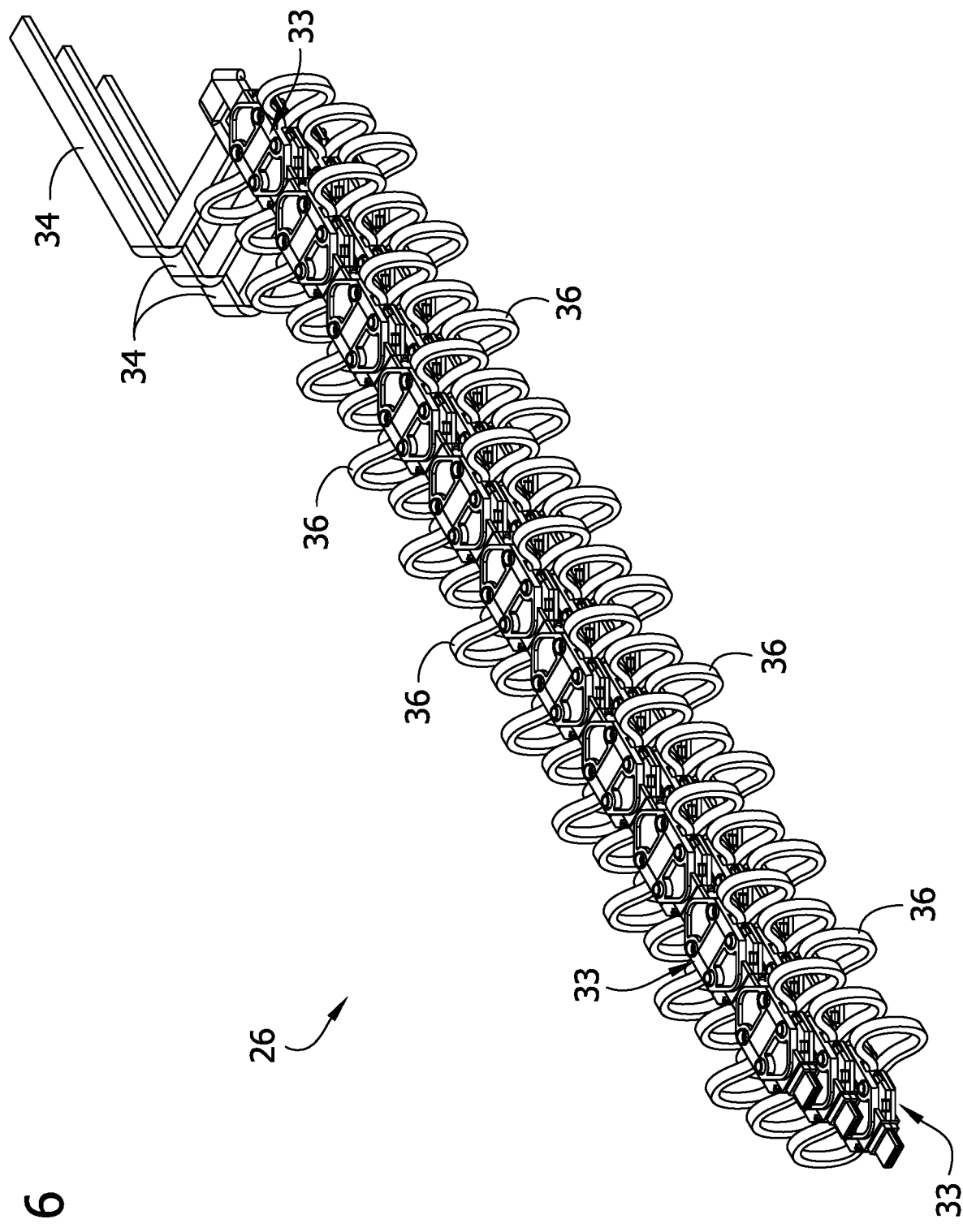
FIG. 6 is a perspective of the conductor assembly in FIG. 3 showing the branch members in a folded configuration.
Figure 7:
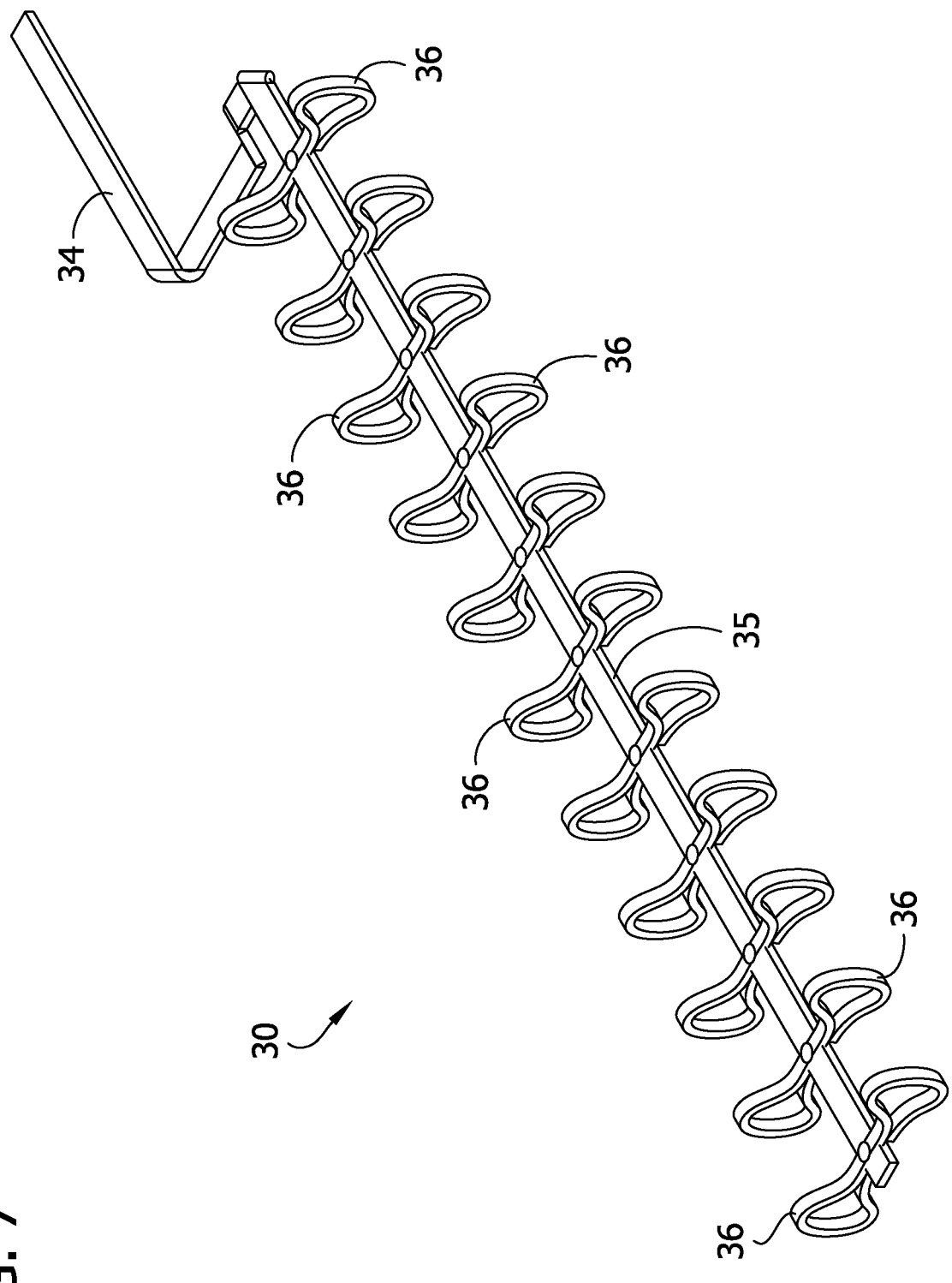
FIG. 7 is a perspective of the conductor in the folded configuration.

Referring to FIGS. 6 and 7, branch members 36 which are not connected to a switching apparatus 32 may be bent or otherwise moved out of the area of the other branch members to provide additional space within the enclosure for the switching apparatuses, and for further insulating the bare conductor end from a service person. As shown in the illustrated embodiment, unused branch members 36 can be bent back towards the casing 33 and the free end sections 44 can be inserted into the casing to shield the free end of the branch member, as will be explained in greater detail below.

Figure 2B:
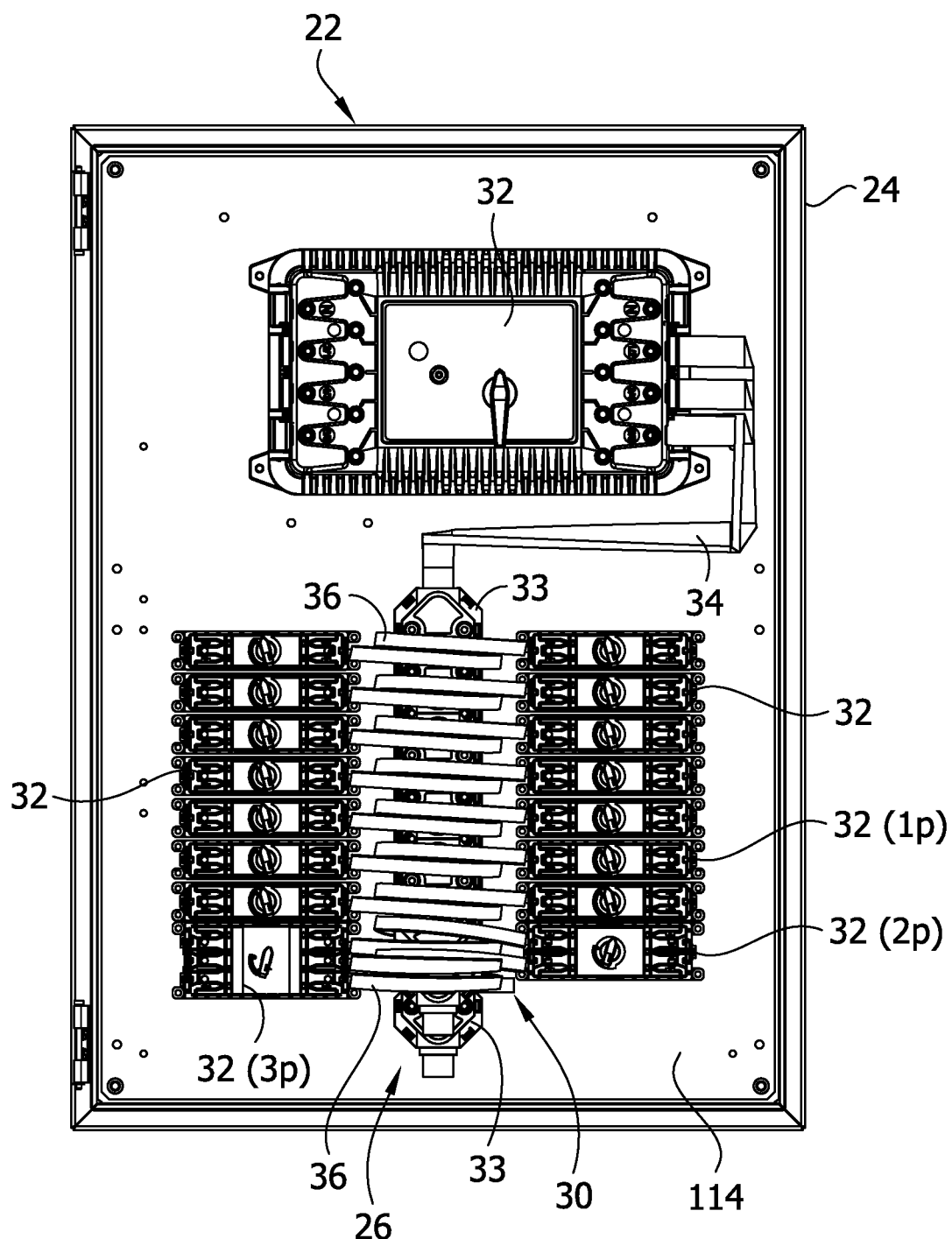
FIG. 2B is a front view of the power distribution assembly in FIG. 2A with a door and internal cover removed showing conductors within the enclosure and connected to multiple switching apparatuses.

As shown in FIGS. 2B, 3, and 6, the flexible and insulated configuration of the conductor assembly 26 also facilitates stacking two or more conductors on top of each other to configure the power distribution assembly for delivering multiple phases of electricity. In this arrangement, a first conductor 30 mounted within a first casing 33 could be configured to distribute a first phase of electricity to a first set of switching apparatus 32 in the enclosure 22, a second conductor 30 mounted within a second casing 33 and placed generally over the first conductor could be configured to distribute a second phase of electricity to a second set of switching apparatus 32 in the enclosure, a third conductor 30 mounted within a third casing 33 and placed generally over the second conductor could be configured to distribute a third phase of electricity to a third set of switching apparatus 32 in the enclosure, and so on. With the conductors 30 stacked on top of each other, the branch members 36 may not align perfectly with a respective switching apparatus 32. This is particularly the case for multiple pole circuit breakers 32. FIG. 2B identifies a 2 pole circuit breakers $32_{(2p)}$ and a 3 pole circuit breaker $32_{(3p)}$. The flexible configuration of the conductor 30, and the branch members 36 in particular, allows for a sound electrical connection to still be made with the switching apparatus, including the multiple pole circuit breakers $32_{(2p)}$, $32_{(3p)}$, by bending, twisting, or otherwise manipulating the branch member to connect with the switching apparatus. The casings 33 surrounding each of the conductors 30 insulates each conductor from any other conductor within the enclosure 22 allowing the conductors 30 to be placed on top of each other without having any interference between the phases.

Referring to FIGS. 3 and 8-12, each casing 33 covers a portion of one of the conductors 30 to cover the exposed conductor sections (i.e., sections not covered by a cover 40) of the conductor creating a touch safe barrier over the conductor so that the enclosure 22 can be safely accessed by a service person. The casings 33 also space the conductor 30 from the other conductors in the enclosure 22 so that there is no electrical interference between the conductors in the conductor assembly 26. Each casing 33 comprises a first casing member 41 and a second casing member 41 attachable to the first casing member. The casing members 41 are configured such that a section of a conductor 30 can be disposed between the casing members and the casing members can be attached to each other to cover the section of the conductor. Additionally, a fastener (not shown) may extend through the casing 33 and engage a back surface of the enclosure 22 to mount the casing 33 and conductor 30 in the enclosure. In one embodiment, the casing members 41 are generally rigid structures.

The first and second casing members 41 are identical in structure and each comprise a generally elongate plate-like configuration. Each casing member 41 comprises a body 43 including a main body section 45 and an extension section 47 extending from a bottom end of the main body section. The main body section 45 has an elongate octagonal shape. However other shapes and configurations are within the scope of the disclosure. The extension section 47 comprises a first extension portion 49 and a second extension portion 51 extending from the first extension portion. The second extension portion 51 is stepped down from the first extension portion 49 forming a shoulder 53 between the extension portions. The body 43 including the main body section 45 and extension section 47 has an inner surface 55 and an outer surface 57. Holes 59 extend through the body 43 from the outer surface 57 to the inner surface 55. The holes 59 permit fasteners to extend through the casing 33 to attach the casing to the enclosure 22. In the illustrated embodiment, there are four (4) holes 59. However, there could be any number of holes without departing from the scope of the disclosure. Additionally, the holes could be omitted and the casing could be mounted to the enclosure by other means.

The body 43 of each casing member 41 defines hole alignment structure disposed around each hole 59 at the inner and outer surfaces 55, 57. A first hole alignment structure 61 is located on the outer surface 57 of the casing members 41 and is disposed around the top two holes 59. The first hole alignment structure 61 includes an annular projection 63 extending outward from the outer surface 57 and configuring the top two holes 59 as counterbore holes on the outer surface of the casing member 41. Thus, the first hole alignment structure 61 includes a flat-bottomed hole section 65 that enlarges another coaxial hole section. A second hole alignment structure 67 is located on the outer surface 57 of the casing members 41 and is disposed around the bottom two holes 59. The second hole alignment structure 67 includes an annular projection 69 extending outward from the outer surface 57 and an annular recess 71 in the outer surface disposed around the annular projection 69. The second hole alignment structure 67, and in particular the annular projection 69, also configures the bottom two holes 59 as counterbore holes on the outer surface of the casing member 41. A third hole alignment structure 73 is located on the inner surface 55 of the casing members 41 and is disposed around the left two holes 59 (as viewed from the outer surface 57) in the casing member. The third hole alignment structure 73 includes an annular projection 75 extending inward from the inner surface 55 and an annular recess 77 in the inner surface and disposed around the annular projection 75. The third hole alignment structure 73, and in particular the annular projection 75, configures the left two holes 59 (as viewed from the outer surface 57) as counterbore holes on the inner surface of the casing member 41. A fourth hole alignment structure 79 is located on the inner surface 55 of the casing members 41 and is disposed around the right two holes 59 (as viewed from the outer surface 57) in the casing member 41. The fourth hole alignment structure 79 includes a first annular projection 81 extending inward from the inner surface 55 and a second annular projection 83 extending inward from the inner surface and disposed around the first annular projection 81 forming an annular floor 85 between the two projections. It will be understood that the hole alignment structures could have other configurations without departing from the scope of the disclosure. Moreover, the hole alignment structures could be omitted.

Figure 10:
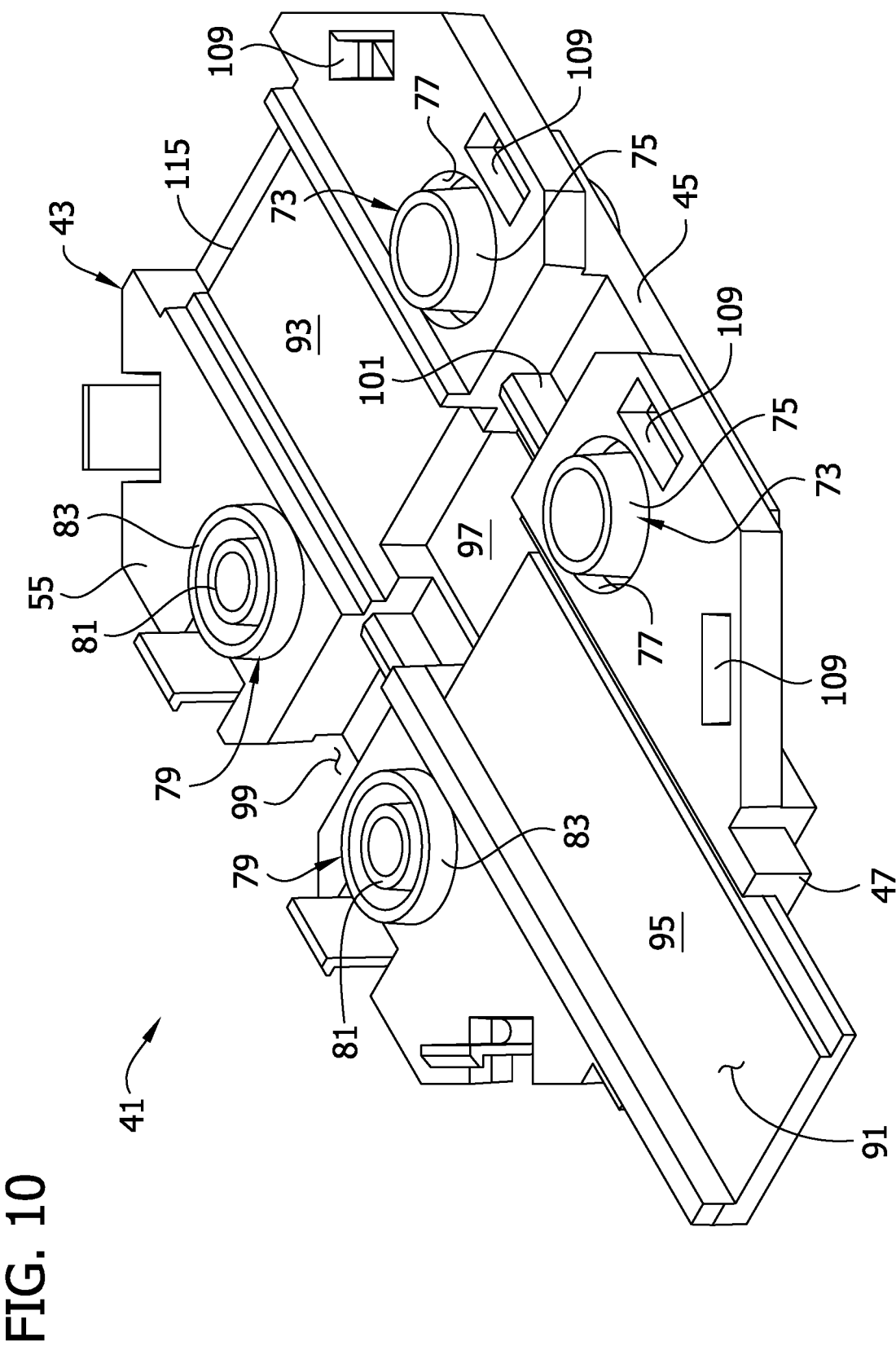
FIG. 10 is a rear perspective of the casing member.
Figure 11:
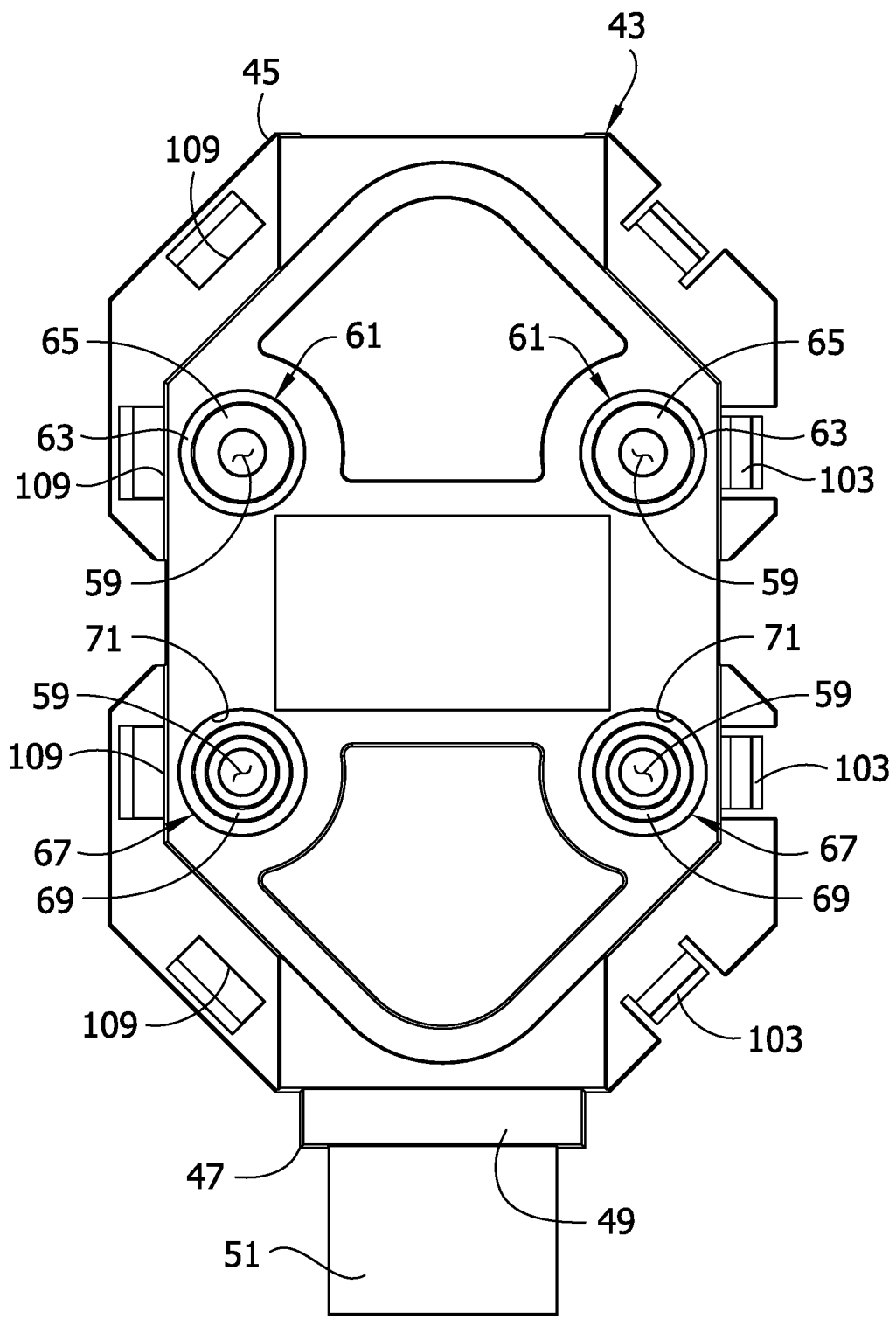
FIG. 11 is front view of the casing member.
Figure 12:
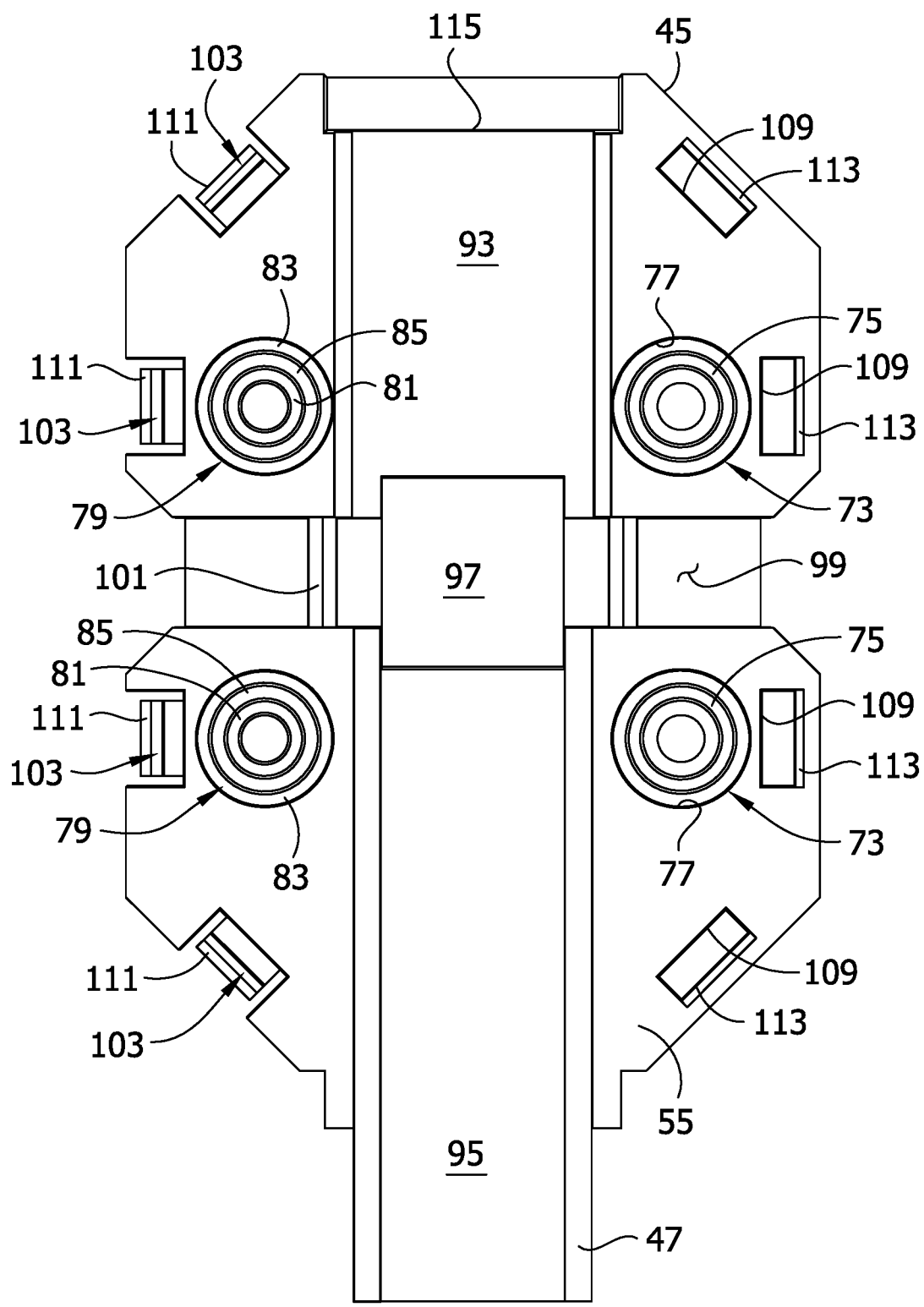
FIG. 12 is a rear review of the casing member.

Referring to FIGS. 10 and 12, a longitudinal channel 91 is formed in the inner surface 55 of the body 43 and extend longitudinally along the body between opposite ends of the body. The longitudinal channel 91 is sized and shaped to receive the central conductor portion 35 of a conductor 30. For example, a width of the longitudinal channel 91 may be slightly larger than a width of the central conductor portion 35 so that the central conductor portion is held securely within the channel. The longitudinal channel 91 has a first section 93 extending from near a top end of the casing member 41 toward a bottom end of the casing member, a second section 95 extending from the bottom end of the casing member toward the top end of the casing member, and a third section 97 between the first and second sections. The first section 93 is recessed below the second section such that the section of the longitudinal channel 91 at the first section is deeper than the section of the longitudinal channel at the second section. As will be explained in greater detail below, the recessed first section 93 provides clearance for the central conductor portion 35 and the extension sections 47 of the casing members 41 of another casing 33 when multiple casings are coupled together in a linear arrangement.

A transverse channel 99 is formed in the inner surface 55 of the body 43 and extends transversely through the body between opposite sides of the body. The transverse channel 99 is sized and shaped to receive a branch member 36 of the conductor 30. For example, a width of the transverse channel 99 may be slightly larger than a width of the branch member 36 so that the branch member is held securely within the channel. Clamps 101 are disposed in the transverse channel 99 on opposite sides of the longitudinal channel 91. The clamps 101 are configured to engage the branch members 36, and in particular the covers 40 on the branch members, to prevent the covers from sliding off. In the illustrated embodiment, the clamps 101 comprise bars that extend the entire width of the transverse channel 99. However, the clamps 101 could have other configurations without departing from the scope of the disclosure.

Figure 8:
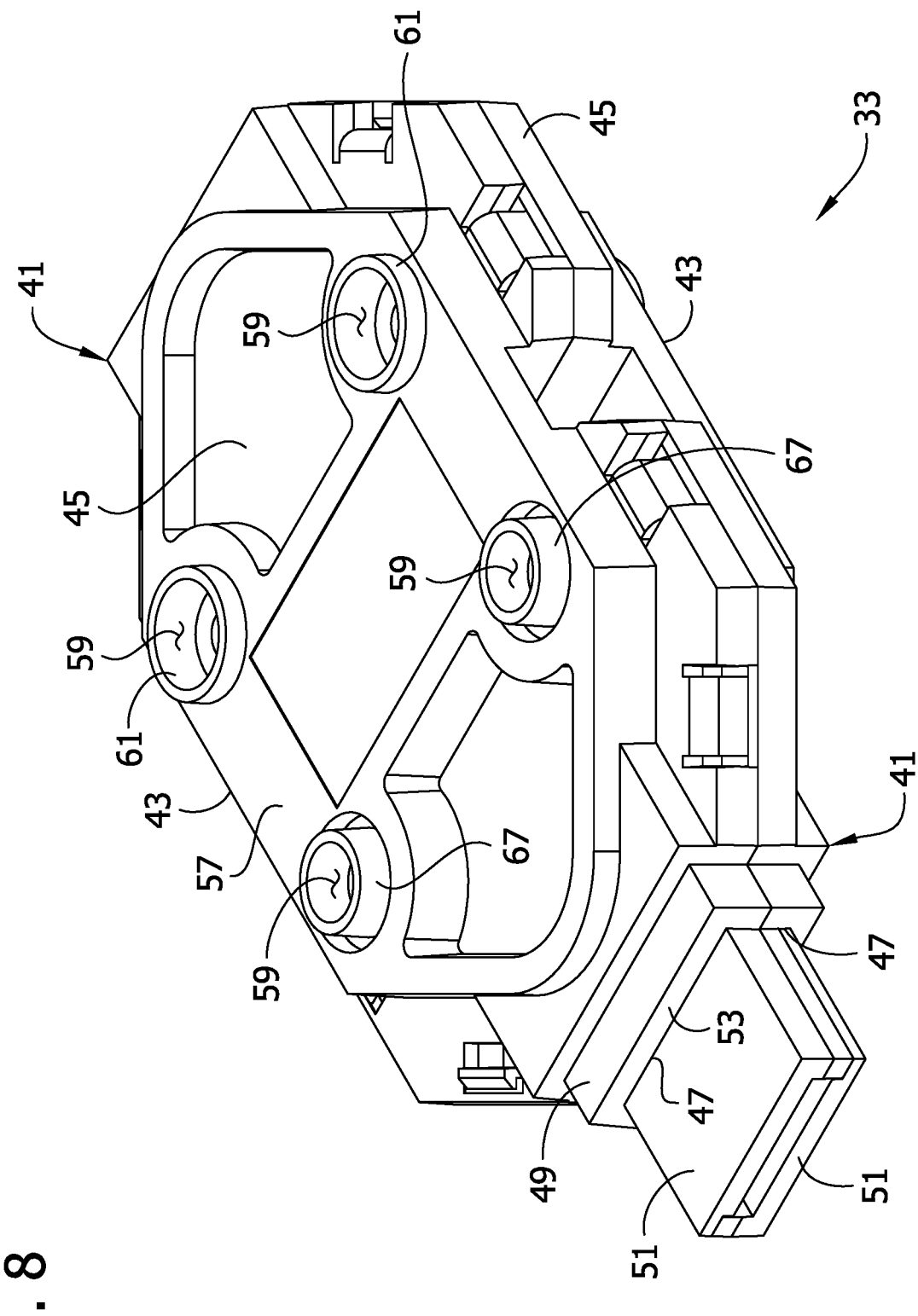
FIG. 8 is a perspective of a casing of the conductor assembly.
Figure 9:
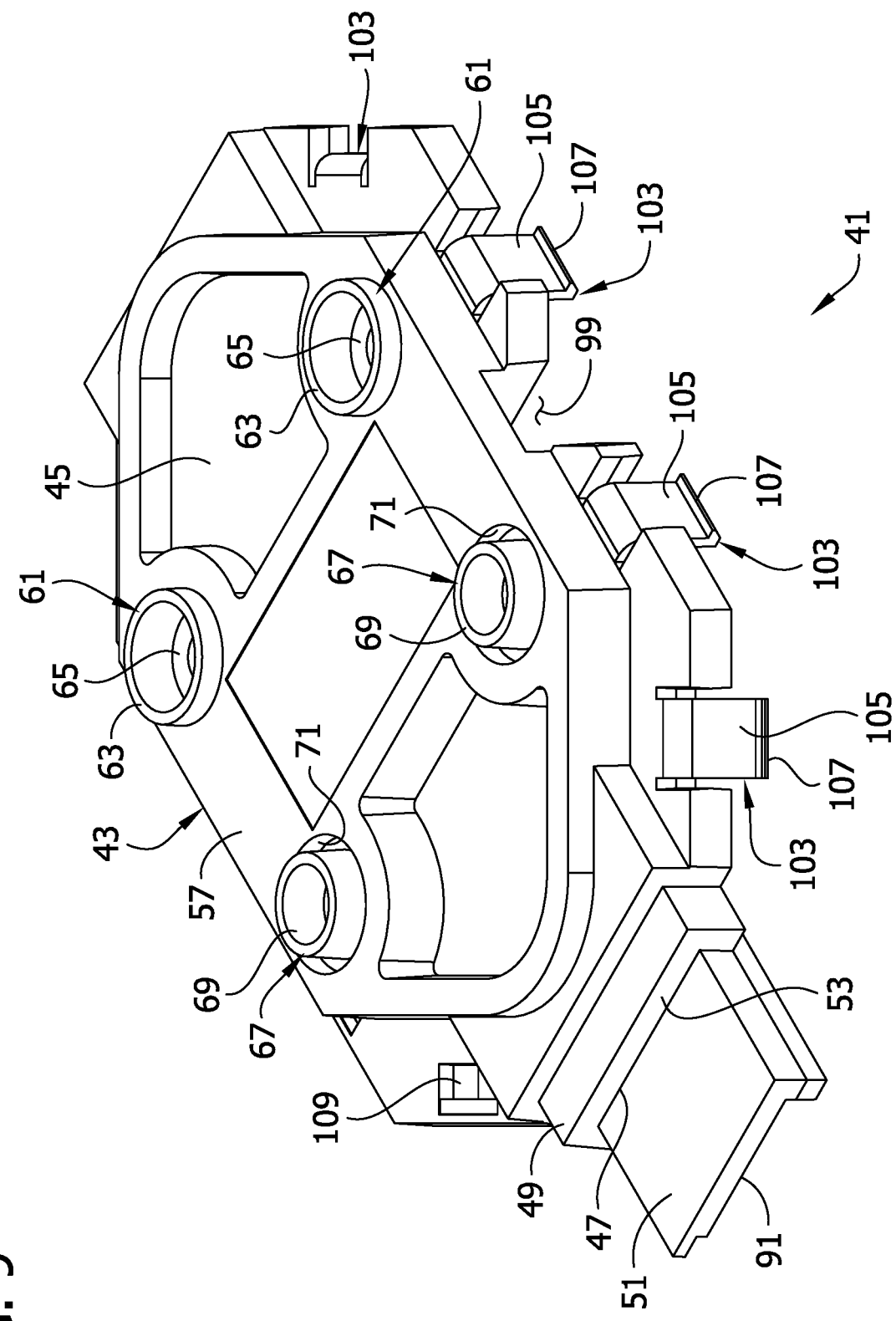
FIG. 9 is a front perspective of a casing member of the casing.

Referring to FIGS. 8-10, clip arms 103 extend from a right side of the body 43 (as viewed from the front of the casing member 41) toward the inner surface 55 of the casing member 41. Each clip arm 103 comprises an arm member 105 and a catch 107 that extends laterally from the arm member 105. Slots 109 are formed in the left side of the body 43 (as viewed from the front of the casing member 41) and are sized and shaped to receive the clip arms 103 of another casing member 41 for attaching the casing members together to form a casing 33. Each catch 107 has an angled surface 111 which is configured to engage a ramp surface 113 in the slots 109 when the clip arms are inserted into the slots. Once fully inserted into the slot 109, the catch 107 will clip over a surface of the body 43 adjacent the slot to secure the casing members 41 together. It will be understood that the clip arms 103 could have other configurations without departing from the scope of the disclosure. Additionally, the casing members 41 could be attached to each other in other ways without departing from the scope of the disclosure. Moreover, other suitable configurations for the casings 33 and other means for mounting the conductors 30 in the enclosure 22 may also be incorporated without departing from the scope of the disclosure.

Figure 2C:
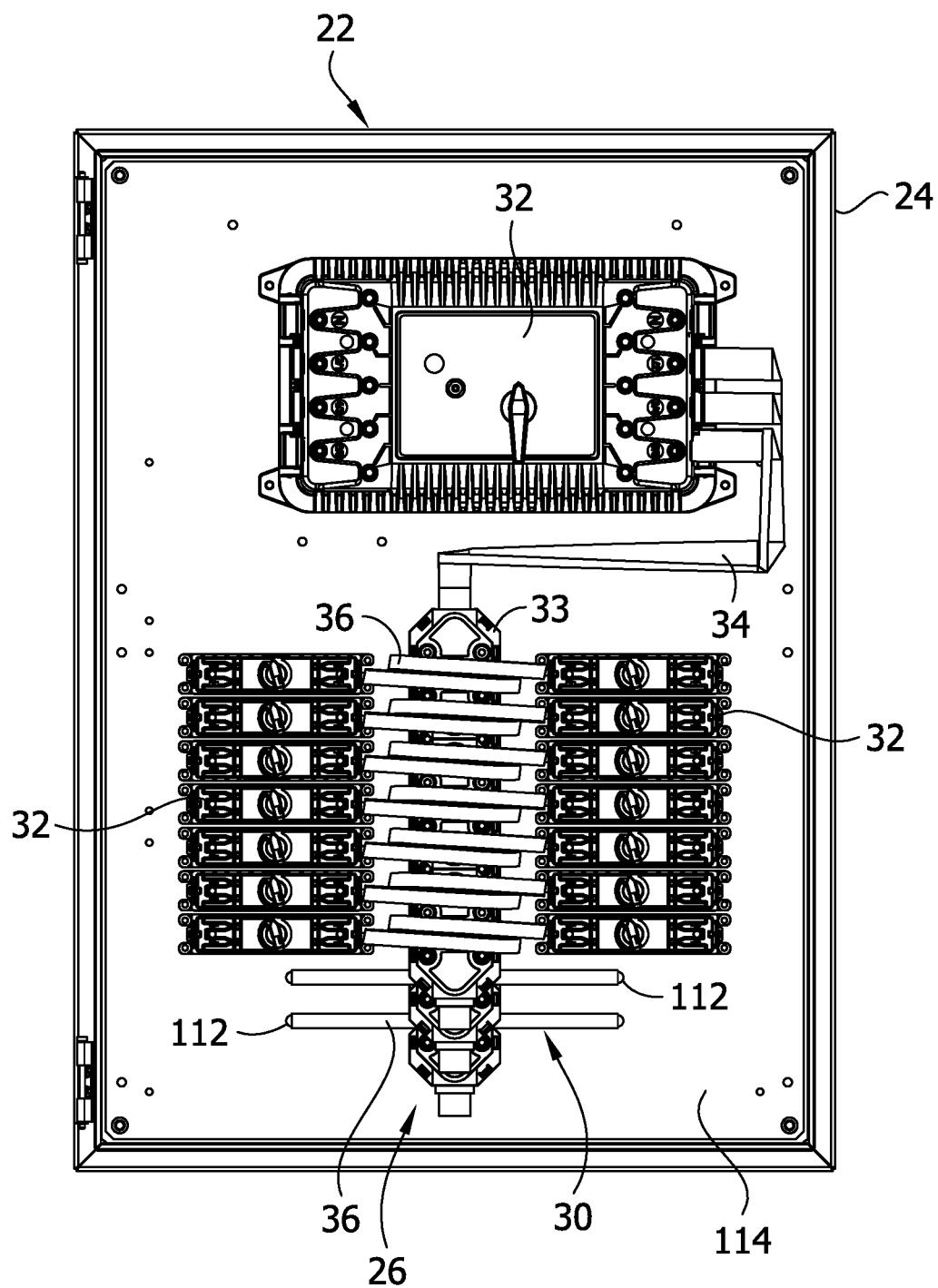
FIG. 2C is a front view of the power distribution assembly in FIG. 2A with the door and internal cover removed showing conductors within the enclosure connected to multiple switching apparatuses and folded back into a mounting plate of the enclosure.

Referring to FIG. 3, the conductor assembly 26 is formed by receiving the conductor 30 between two casing members 41 and securing the casing members together around the conductor. The central conductor portion 35 of the conductor 30 is received in the longitudinal channels 91 of the casing members 41 and a branch member 36 of the conductor is received in the transverse channels 99. The longitudinal channels 91 together may form a longitudinal passage for receiving the central conductor portion 35, and the transverse channels 99 together may form a transverse passage for receiving the branch member 36. To align the casing members 41 with respect to each other for attaching the casing members together, the hole alignment structures 73, 79 on the inner surface 55 of the casing members are aligned and engaged with each other to guide the casing members into secured engagement. In one embodiment, the third hole alignment structures 73 around the left two holes 59 of a first casing member 41 are mated with the fourth hole alignment structures 79 around the right two holes of a second casing member 41. In particular, the annular projection 75 of the third hole alignment structure 73 is inserted between the first and second annular projections 81, 83 of the fourth hole alignment structure 79 and seated on the floor 85 between the first and second projections. The first annular projection 81 of the fourth hole alignment structure 79 will simultaneously seat on the counterbore of the third hole alignment structure 73. Upon the seating of the annular projections 75, 81, 83, the clip arms 103 will be fully inserted into the slots 109 whereby the catches 107 will clip over the surface of the body 43 adjacent the slots and secure the casing members together. As a result, the conductor 30 will be securely held within the casing 33 formed by the two casing members 41. For example, the surfaces of the longitudinal channels 91 will engage at least a section of the central conductor portion 35 to hold the central conductor in place. The clamps 101 in the transverse channels 99 will engage the branch member 36 to secure the branch member in place. More particularly, the clamps 101 will engage the covers 40 of the branch members 36 to prevent the covers from sliding. In instances where the branch members 36 and/or flexible central conductor portion 34 are not previously attached to the rigid central conductor portion 35, the attachment of the casing members 41 to each other may also attach the conductor portions together. The transverse channels 99 may also provide an open space for the ends of the branch members 36 that are not attached to switching apparatuses to be folded back and inserted into the casing so that the exposed ends 44 are shielded by the casing to prevent contact with a user. This arrangement is shown in FIGS. 6 and 7. In one embodiment, the free ends of the branch members 36 are retained in the transverse channels 99 by a press fit. Alternatively, slots 112 in a mounting plate 114 of the enclosure 22 may receive the exposed ends 44 of the branch members 36 that are not connected to circuit breakers 32 to insulate the ends of the branch members from a user (FIG. 2C).

Figure 13:
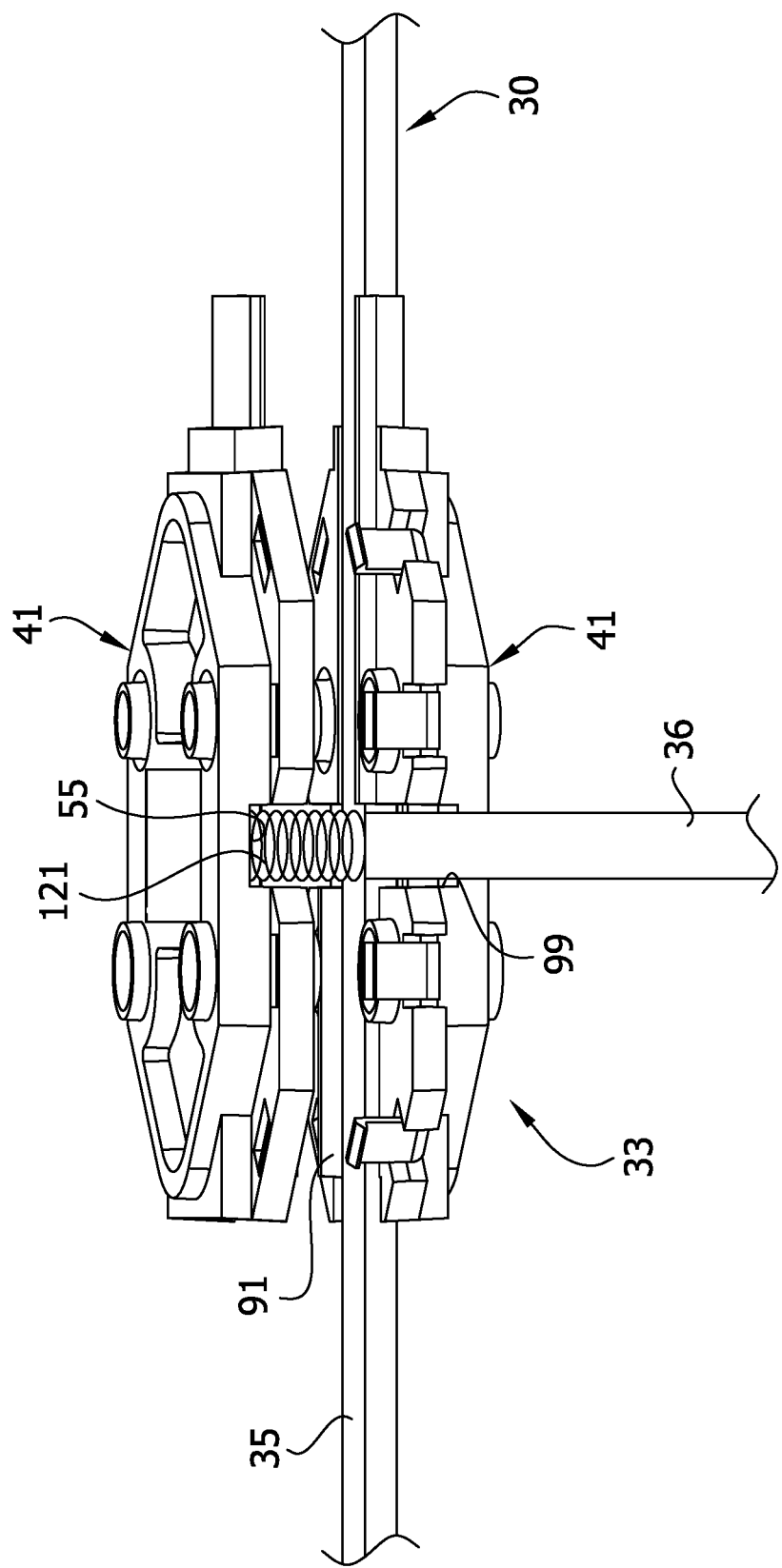
FIG. 13 is a fragmentary perspective of a conductor assembly including a spring member.
Figure 14:
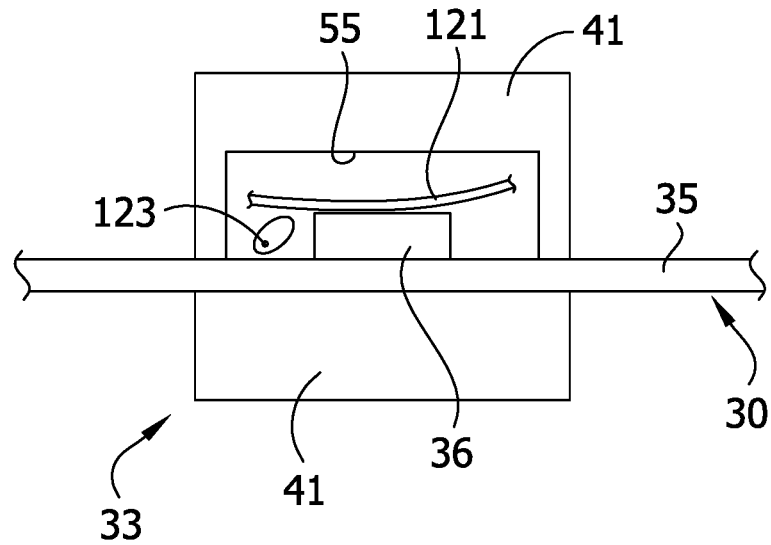
FIG. 14 is a schematic illustration of a conductor assembly including another embodiment of a spring member.
Figure 15:
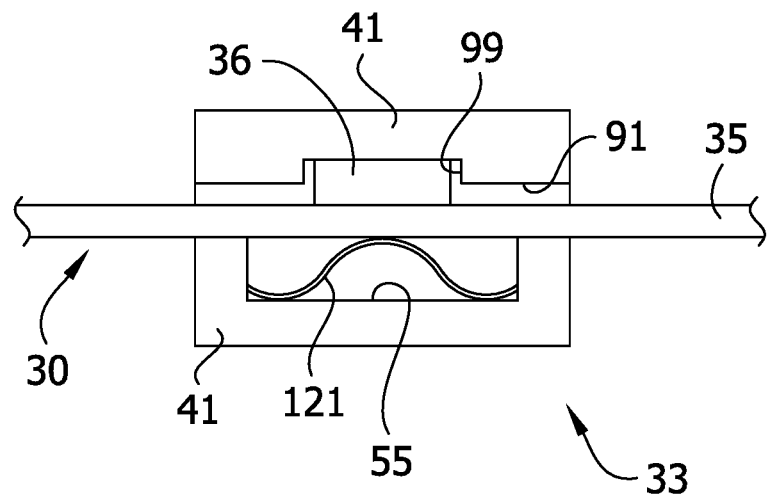
FIG. 15 is a schematic illustration of a conductor assembly including another embodiment of a spring member.

Referring to FIGS. 13-15, a spring member 121 may be disposed between the casing members 41 of a casing 33 to apply a compressive force to the conductor 30. Thus, the spring member 121 may provide additional structure for holding the conductor 30 in place in the casing 33. Further, in embodiments in which the casing 33 is used to attach the branch member 36 to the central conductor portion 35, such as when a weld or other suitable attachment means is not used, the spring member 121 may be used to apply the force needed to serve as the attachment mechanism for the components of the conductor. Thus, the spring member 121 is configured to provide a contact resistance sufficient for the components of the conductor 30 to form an electrical connection. In one embodiment, the spring member 121 is configured to provide at least about 50 lbs of force to the conductor 30 when the conductor is received in the casing 33.

The spring member 121 may be constructed in any suitable manner for providing the necessary compressive force to the conductor 30. For example, the spring member 121 may comprise a coil compression spring (FIG. 13). The coil spring 121 may be mounted to the inner surface 55 of one of the casing members 41 such that the coil spring is disposed between the casing member and the conductor 30. In one embodiment, the coil spring 121 is mounted at the juncture between the longitudinal channel 91 and transverse channel 99. With the casing members 41 attached to each other, the coil spring 121 is urged or compressed against its bias to provide a compressive force to the conductor 30 for holding the central conductor portion 35 and the branch member 36 together. The spring member 121 may also be a cantilevered spring (FIG. 14). In this embodiment, one end of the cantilevered spring 121 may be mounted to the inner surface 55 of one of the casing members 41 whereby at least a portion of the spring member is positioned to engage the conductor 30 when the casing members are attached to each other. The engagement will be such that the cantilevered spring 121 is flexed from its natural position thereby providing a compressive force to the conductor 30. The cantilevered spring 121 may comprise a cam 123 configured to receive a tool (not shown) for relieving the pressure placed on the conductor 30 by the spring so that the components of the conductor can be adjusted or removed as needed. The spring member 121 may also comprise a spring plate (FIG. 15). The spring plate 121 can be mounted to the inner surface 55 of one of the casing members 41 such that when the casing members are attached to each other, the spring plate will be deformed by the conductor 30 thereby applying a compressive force to the conductor to hold the components of the conductor together. In one embodiment, the spring plate 121 is mounted at the juncture between the longitudinal channel 91 and transverse channel 99. In one embodiment, the spring plate 121 is formed from spring steal. Other configurations of the spring member are also envisioned without departing from the scope of the disclosure.

Two or more casings 33 can also be connected to each other in a linear fashion as shown in FIGS. 3 and 6. For example, the extension sections 47 of the casing members 41 of a first casing 33 are received in a top end of a second casing 33, between the two casing members that form the second casing to connect the first casing to the top of the second casing. The shoulder 53 between the first and second extension portions 49, 51 of the extension sections 47 of the first casing 33 will seat against stops 115 on the inner surfaces 55 of the casing members 41 of the second casing 33 to properly position the first casing in the second casing. With the extension members 47 of the first casing 33 between the casing members 41 of the second casing 33, when the casing members of the second casing are secured together, the first casing will be captured between the casing members of the second casing thereby connecting the first and second casing together. Overlapping the casings 33 in this manner further ensures that creepage and clearance requirements are met by insulating the intersection between the casings. This process can be repeated to connect any desired number of casings 33 together. The casings 33 could also be connected to each other in other ways without departing from the scope of the disclosure.

Two or more casing 33 can also be connected to each other in a stacked configuration as shown in FIGS. 3 and 6. For example, the second hole alignment structure 67 of the bottom two holes 59 on the outer surface 57 of a bottom casing member 41 of a first casing 33 can be mated with corresponding first hole alignment structure 61 of the top two holes 59 on the outer surface 57 of a top casing member 41 of a second casing 33 to stack the first casing on top of the second casing. In particular, the annular projection 69 of the second hole alignment structure 67 will be received in the counterbore hole 59 of the first hole alignment structure 61 such that the annular projection seats on the flat-bottom hole section 65, and the annular projection 63 of the first hole alignment structure is received in the annular recess 71 of the second hole alignment structure thereby at least temporarily holding the casings 33 in place on each other. A fastener can then be inserted through at least one of the holes 59 to secure the casings 33 to the enclosure 22 and thereby to each other. This will also slightly stagger or offset the first and second casings 33 whereby the second casing will extend below the first casing, and the first casing will extend above the second casing. Therefore, the branch member 36 associated with the first casing 33 will be offset from the branch member 36 associated with the second casing 33 which allows for the use of multiple phases in the conductor assembly 26. This process can be repeated to stack any desired number of casings 33 on top of each other. The casings 33 could also be stacked on top of each other in other ways without departing from the scope of the disclosure.

The ability to link multiple casing 33 together in a linear configuration, as well as the ability to stack multiple casing on top of each other configures the power distribution assembly 20 for delivering multiple phases of electricity. In particular, multiple conductors 30 can be mounted in the enclosure 22 and separated by the insulating casings 33 to provide for the delivery of multiple phases of electricity. Thus, a first conductor 30 may be configured to distribute a first phase of electricity to a first set of switching apparatuses 32 in the enclosure 22, a second conductor 30 may be configured to distribute a second phase of electricity to a second set of switching apparatuses 32 in the enclosure, and a third conductor 30 may be configured to distribute a third phase of electricity to a third set of switching apparatuses 32 in the enclosure. The casings 33 and insulating covers 40 insulate each conductor from the other conductors of the conductor assembly 26 allowing the conductors 30 to be stacked on top of each other without having any interference between the phases. Thus, the casings 33 prevent phase-to-phase shorting when the conductors 30 are stacked on top of each other. It is envisioned that the conductor assembly 26 could have a different number of conductors 30 for distributing a different number of phases of electricity without departing from the scope of the disclosure.

Having described the invention in detail, it will be apparent that modifications and variations are possible without departing from the scope of the invention defined in the appended claims.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An electrical conductor assembly for use in a power distribution assembly comprising:
a flexible electrical conductor including a main conductor portion comprising electrically conductive material, and at least one branch member comprising electrically conductive material extending laterally from the main conductor portion;
a casing covering at least a portion of the electrical conductor, the casing comprising first and second casing members attached to each other, a longitudinal channel formed in an inner surface of one of the casing members and extending longitudinally along the casing member between opposite ends of the casing member, the longitudinal channel being sized and shaped to receive the main conductor portion of the electrical conductor, and a transverse channel formed in the inner surface of the casing member and extending transversely through the casing member between opposite sides of the casing member, the transverse channel being sized and shaped to receive the at least one branch member of the electrical conductor; and
a spring member mounted to the casing and configured to apply a compressive force to the electrical conductor.

2. The electrical conductor assembly of claim 1, wherein the branch member is selectively bendable and configured for electrical connection to an electrical switching apparatus.

3. The electrical conductor assembly of claim 2, wherein the electrically conductive material of the at least one branch member comprises multiple layers of laminated conductive material.

4. The electrical conductor assembly of claim 2, wherein the spring member is configured to apply a sufficient force to the flexible electrical conductor such that the main conductor portion and the at least one branch member are electrically connected.

5. The electrical conductor assembly of claim 4, wherein the spring member is configured to provide at least 50 lbs of force to the flexible electrical conductor.

6. The electrical conductor assembly of claim 2, wherein the casing and spring member provide the only attachment mechanisms for connecting the at least one branch member to the main conductor portion.

7. The electrical conductor assembly of claim 1, wherein the spring member comprises one of a coil spring, a cantilever spring, and a spring plate.

8. The electrical conductor assembly of claim 7, wherein the spring member comprises a cantilever spring and a cam configured to receive a tool to move the cantilever spring to relieve the compressive pressure on the electrical conductor to permit adjustment of the electrical conductor in the casing.

9. The electrical conductor assembly of claim 1, wherein the first and second casing members have mating alignment structure to properly position the casing members relative to each other for attaching the casing members to each other.

10. The electrical conductor of claim 1, wherein the casing insulates said at least a portion of the electrical conductor.

11. The electrical conductor assembly of claim 1, wherein the casing is rigid.

12. A power distribution assembly comprising
an enclosure;
a flexible electrical conductor disposed in the enclosure, the flexible electrical conductor comprising a main conductor portion comprising electrically conductive material and a plurality of branch members comprising electrically conductive material extending laterally from the main conductor portion, each branch member being selectively bendable and configured for electrical connection to an electrical switching apparatus; and
a plurality of casings covering portions of the flexible electrical conductor, each casing including a spring member mounted to the casing and configured to apply a compressive force to the flexible electrical conductor, each casing further comprising first and second casing members attached to each other, a longitudinal channel being formed in an inner surface of one of the casing members and extending longitudinally along the casing member between opposite ends of the casing member, the longitudinal channel being sized and shaped to receive the main conductor portion of the electrical conductor, and a transverse channel formed in the inner surface of the casing member and extending transversely through the casing member between opposite sides of the casing member, the transverse channel being sized and shaped to receive one of the branch members of the electrical conductor.

13. The electrical conductor assembly of claim 1, wherein the spring member is mounted at a juncture between the longitudinal channel and transverse channel.

14. The assembly of claim 12, wherein each casing is rigid.

15. The assembly of claim 12, wherein the assembly is configured to distribute multiple phases of electricity.

16. The assembly of claim 12, wherein each spring member is configured to apply a sufficient force to the flexible electrical conductor such that the main conductor portion and a respective branch member are electrically connected.

17. The assembly of claim 16, wherein each spring member is configured to provide at least 50 lbs of force to the flexible electrical conductor.

18. The assembly of claim 16, wherein the casings and spring members provide the only attachment mechanisms for connecting the branch members to the main conductor portion.

19. The assembly of claim 12, wherein the spring members comprise one of a coil spring, a cantilever spring, and a spring plate.

20. The assembly of claim 12, wherein the casings comprise first and second casing members attached to each other.

* * * * *